US009111937B2

(12) United States Patent
Carpenter, Jr. et al.

(10) Patent No.: US 9,111,937 B2
(45) Date of Patent: Aug. 18, 2015

(54) SEMICONDUCTOR DEVICES WITH MULTILAYER FLEX INTERCONNECT STRUCTURES

(71) Applicant: Freescale Semiconductor, Inc., Austin, TX (US)

(72) Inventors: Burton J. Carpenter, Jr., Austin, TX (US); Twila J. Eichman, San Marcos, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 197 days.

(21) Appl. No.: 13/903,230

(22) Filed: May 28, 2013

(65) Prior Publication Data
US 2014/0353830 A1 Dec. 4, 2014

(51) Int. Cl.
H01L 23/52 (2006.01)
H01L 23/532 (2006.01)
H01L 23/522 (2006.01)
H01L 23/538 (2006.01)

(52) U.S. Cl.
CPC ...... *H01L 23/53228* (2013.01); *H01L 23/5226* (2013.01); *H01L 23/5329* (2013.01); *H01L 23/5381* (2013.01); *H01L 23/5383* (2013.01); *H01L 23/5387* (2013.01); *H01L 23/5389* (2013.01); *H01L 2224/04105* (2013.01); *H01L 2924/30107* (2013.01)

(58) Field of Classification Search
CPC ............... H01L 23/5389; H01L 2224/04105; H01L 2924/30107
USPC .................. 257/700, 748, 750, 758
See application file for complete search history.

(56) References Cited

U.S. PATENT DOCUMENTS

| 5,295,838 | A | 3/1994 | Walen et al. | |
|---|---|---|---|---|
| 5,852,326 | A | 12/1998 | Khandros et al. | |
| 6,699,730 | B2 | 3/2004 | Kim et al. | |
| 6,924,551 | B2 | 8/2005 | Rumer et al. | |
| 7,081,373 | B2 | 7/2006 | Roeters et al. | |
| 7,205,674 | B2 * | 4/2007 | Huang et al. | 257/787 |
| 8,492,203 | B2 * | 7/2013 | Lin et al. | 438/118 |
| 2003/0025211 | A1 | 2/2003 | Bruce et al. | |
| 2003/0042587 | A1 | 3/2003 | Lee | |
| 2007/0001282 | A1 * | 1/2007 | Kang et al. | 257/692 |

OTHER PUBLICATIONS

Herrick, Interconnects for a Multi-layer Three-dimensional Silicon Architecture, Microwave Journal, May 1, 2011, available at http://www.microwavejournal.com/articles/print/3204-interconnects-for-a-multi-layer-three-dimensional-silicon-architecture.

* cited by examiner

*Primary Examiner* — Howard Weiss
*Assistant Examiner* — Tifney Skyles
(74) *Attorney, Agent, or Firm* — Luiz von Paumgartten; Fogarty, L.L.C.

(57) ABSTRACT

Semiconductor devices with multilayer flex interconnect structures. In some embodiments, a semiconductor device may include a semiconductor chip coupled to a planar substrate and a multilayer flex interconnect structure coupled to the semiconductor chip, the multilayer flex interconnect structure including at least: a first conductive layer, a second conductive layer, and a dielectric layer disposed between the first and second conductive layers. The semiconductor device may also include another semiconductor chip coupled to the planar substrate and placed in a side-by-side configuration with respect to the semiconductor chip, where the multilayer flex interconnect structure provides electrical connections between at least two terminals of the semiconductor chip and at least two terminals of the other semiconductor chip.

19 Claims, 4 Drawing Sheets

SEMICONDUCTOR DEVICES WITH MULTILAYER FLEX INTERCONNECT STRUCTURES

FIELD

This disclosure relates generally to semiconductor devices, and more specifically, to semiconductor devices with multilayer flex interconnect structures.

BACKGROUND

Most modern electronic devices include one or more electronic components, each component having one or more semiconductor chips, and each chip having one or more integrated circuits (ICs) manufactured thereon. Typically, a chip is mounted on a substrate and then encapsulated by a package that serves, among other things, to physically protect the chip. Within the electronic component, a chip may be coupled to other internal elements, such as, for example, other chip(s), using a chip interconnect structure or the like.

Wire bonding is popular type of chip interconnect method. In wire bonding, a chip may be secured to the surface of a substrate such that the chip is surrounded by contact pads on the substrate. Thin wires may then connect contacts on the chip to contact pads on the substrate. Wire bonds may also connect a chip's contacts to another chip's contacts within the same package.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Figure 1:
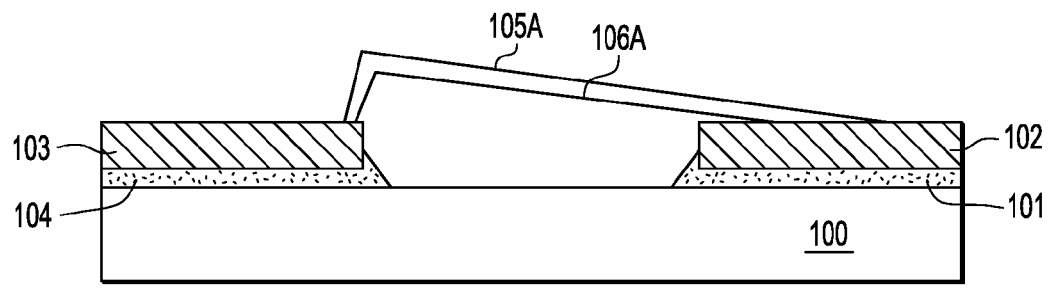
FIGS. 1 and 2 are cross-section diagrams of a prior art semiconductor component with wire bonding structures.

Systems and methods described herein show the use of multilayer flex interconnect structures to couple two or more chips (or a chip and a substrate) internal to an electronic component. In some applications, the two or more chips may be encapsulated by a mold compound. Also, in some embodiments, one or more dielectric layers of the multilayer flex interconnect structure may provide mechanical support for the structure and minimize its physical movement due to a molding or packaging process. Conductive layers of either side of the dielectric layer(s) may allow two or more signals, reference buses, or voltage buses to be provided between chips where otherwise only one conductor would be present (e.g., in wire bonding). Use of a multilayer flex interconnect structure within an electronic component may also reduce interconnect impedance variations and inductance effects, and it may increase overall manufacturing tolerance.

The term "flex," as used herein, refers to an electronic or electric circuit mounted or otherwise manufactured on a flexible plastic material or film. Examples of flexible plastic materials that may be used to form a flex structure include, but are not limited to, polyester (PET), polyimide (PI), polyethylene napthalate (PEN), Polyetherimide (PEI), fluropolymers (FEPs), and the like. As discussed in more detail below, an "interconnect structure" is a structure suitable for providing electrical connection(s) between two or more input/output (I/O) terminals; where an "I/O terminal" refers to an input terminal, an output terminal, or a combination thereof.

The term "multilayer flex interconnect structure," as used herein, refers to a flex interconnect structure having at least two or more conductive layers. For instance, a multilayer flex interconnect structure may include a first conductive layer, a second conductive layer, and a dielectric layer disposed between the first and second conductive layers. The first and second conductive layers may include copper, gold, alloyed aluminum, etc.; and the dielectric layer may include one or more of the aforementioned flexible plastic materials. In addition to providing electrical insulation between the two or more conductive layers, the dielectric layer may also serve as a mechanical structure that supports other layers of the multilayer flex interconnect structure.

In some cases, a protective cover layer (e.g., any suitable dielectric material) may be formed on one or on both of the first and second conductive layers, on sides opposite of the dielectric layer. It should be emphasized, however, that a multilayer flex interconnect structure may include three of more conductor layers. For instance, extending the foregoing example, the multilayer flex interconnect structure may include a third conductive layer with another dielectric layer between the second and third conductive layers.

As used herein, the term "electronic component" refers to a monolithic component—that is, a component cast as a single piece—that includes one or more semiconductor chips which are attached to a rigid, planar substrate (e.g., made of a silicon monocrystal wafer, a silicon on sapphire wafer, a gallium arsenide wafer, or the like), and sometimes encapsulated by a mold compound. The mold compound (e.g., epoxy resins, etc.), when present, forms a package designed to prevent physical damage and corrosion to the semiconductor chip, and that supports the electrical contacts which connect the component to a circuit board, chassis, or the like.

Generally speaking, during manufacturing of an electronic component, one or more semiconductor chips may be attached to the substrate using an adhesive material. Then, a process takes place whereby an Integrated Circuit (IC) previously fabricated on the chip(s) is electrically coupled to other ICs, to the substrate, and/or to other terminals that provide connections to circuits external to the electronic component. A known way of providing these connections is by using a wire bonding process, which is described in FIGS. 1 and 2 below. After that, the device is encapsulated with the mold compound, which envelops the chip(s), substrate, and wire bonds to create a package in the form of a monolithic electronic component.

FIG. 1 is a cross-section diagram of a prior art semiconductor component with wire bonding structures. Particularly, chips 102 and 103 are coupled to substrate 100 via layers of adhesive material 101 and 104, respectively. In this example, an I/O terminal on first chip 102 is coupled to another I/O terminal on second chip 103 via first wire bond 105A.

Another I/O terminal on first chip 102 is coupled to yet another I/O terminal on second chip 103 via second wire bond 106A. In some cases, the wires making up wire bonds 105A and 106A can each have diameters of approximately 20 μm. Here it should be noted that, because wire bonds 105A and 106A are distant from the substrate, these wires inadvertently introduce large inductance effects.

Figure 2:
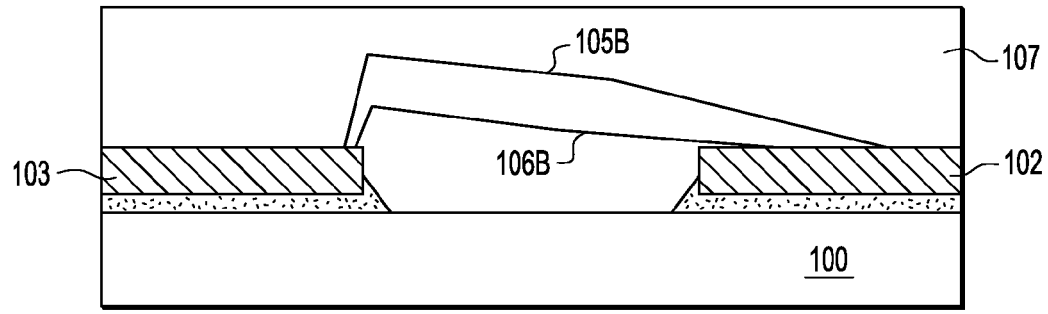

In FIG. 2, mold compound 107 has been applied over elements 100-106A as a part of a packaging process to continue the manufacturing of the semiconductor component. Original wire bonds 105A and 106A are now represented as 105B and 106B to indicate that they have physically moved with respect to other elements (and with respect to one another) as a result of the packaging process. Because the ultimate location of wire bonds 105B and 106B is subject to manufacturing variability, this in turn causes uncontrolled impedance variations.

Figure 3:
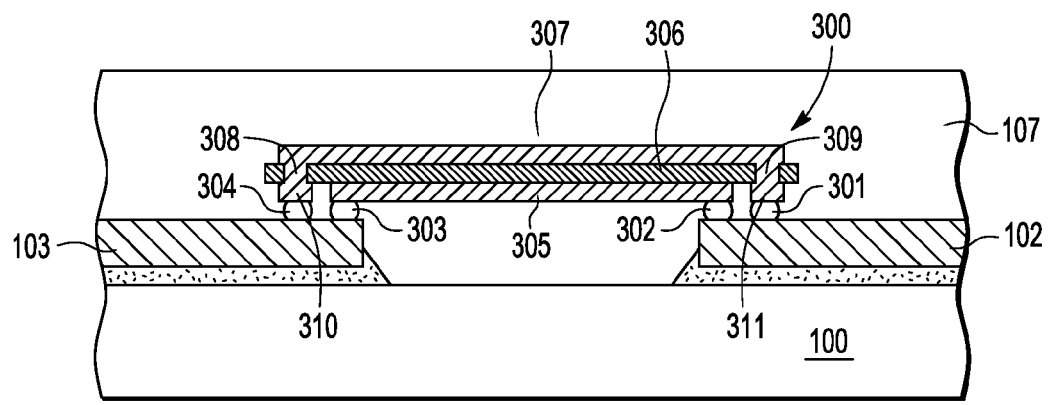
FIG. 3 is a cross-section diagram of a semiconductor component with a multilayer flex interconnect structure coupling two chips according to some embodiments.

FIG. 3 is a cross-section diagram of a semiconductor component with a multilayer interconnect structure coupling two chips according to some embodiments. Here chips 102 and 103 are also disposed in a side-by-side configuration, but are interconnected by multilayer flex interconnect structure 300. Particularly, multilayer flex interconnect structure 300 is generally parallel to substrate 100.

In this implementation, flex interconnect structure 300 includes first conductive layer 307, second conductive layer 305, and dielectric layer 306 disposed between first and second conductive layers 307 and 305, respectively. First conductive layer 307 is coupled to conductive vias 308 and 309 fabricated in dielectric layer 306, which in turn are coupled to conductive pads 310 and 311 respectively. First conductive layer 307 couples a first I/O terminal in first chip 102 through conductive via 309, conductive pad 311, and solder joint 301 to a first I/O terminal in second chip 103 through conductive via 308, conductive pad 310, and solder joint 304. Conversely, second conductive layer 305 couples a second I/O terminal in first chip 102 via solder joint 302 to a second I/O terminal in second chip 103 via solder joint 303.

In contrast with the wire bond approach shown in FIGS. 1 and 2, the inductance of multilayer flex interconnect structure 300 may be reduced or minimized by including dielectric layer 306. Use of dielectric layer 306 also provides mechanical support for structure 300 and reduces or minimizes the physical movement of interconnect structure 300 due to molding or packaging process; thus also reducing or minimizing impedance variations. More generally, use of multilayer flex interconnect structure 300 within a monolithic electronic component, as described herein, reduces manufacturing variations.

In some implementations, first conductive layer 307 and second conductive layer 305 may each be approximately 18 μm thick, and dielectric layer 306 may be approximately 50 μm thick. Conductive pads 310 and 311 may be formed during the same fabrication process as conductive layer 305, and may have the same thickness. It should be noted, however, that other dimensions may be used. As previously stated, the elements of FIG. 3 have not necessarily been drawn to scale for ease of explanation.

In some embodiments, first conductive layer 307 and second conductive layer 305 may be configured to carry different signals. For example, first conductive layer 307 may carry a first digital or analog signal, and second conductive layer 305 carry a second digital or analog signal. As another example, first conductive layer 307 may carry a digital or analog signal, and second conductive layer 305 extend a reference bus between chips 102 and 103. As yet another example, at least one of first or second conductive layers 307 or 305 may extend a voltage reference bus or power supply between chips 102 and 103.

Figure 4:
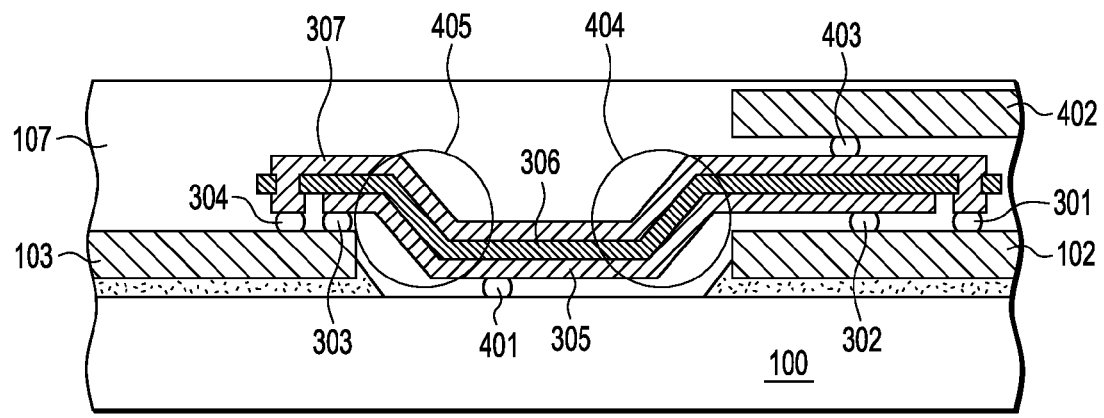
FIG. 4 is a cross-section diagram of a semiconductor component with multilayer flex interconnect structures coupling three chips according to some embodiments.

FIG. 4 is a cross-section diagram of a semiconductor component with a multilayer interconnect structure coupling three chips. In this embodiment, chips 102 and 103 are disposed in a side-by-side configuration, and chip 402 is stacked on top of chip 102. Multilayer flex interconnect structure 300 has two bent portions 404 and 405 that allow it to make a connection to substrate 100 via solder joint 401. In addition, chip 402 is coupled to first conductive layer 307 via solder joint 403.

In the examples of FIGS. 3 and 4, the I/O terminals of chips 102, 103, and 402 are coupled to conductive layers 305 or 307 via solder joints 301-304 or 403. In other cases, however, other types of bonds such as, for example, thermo-compression bonds, may be used to connect chips 102, 103, and 402 to various layers of multilayer flex interconnect structure 300.

Figure 5:
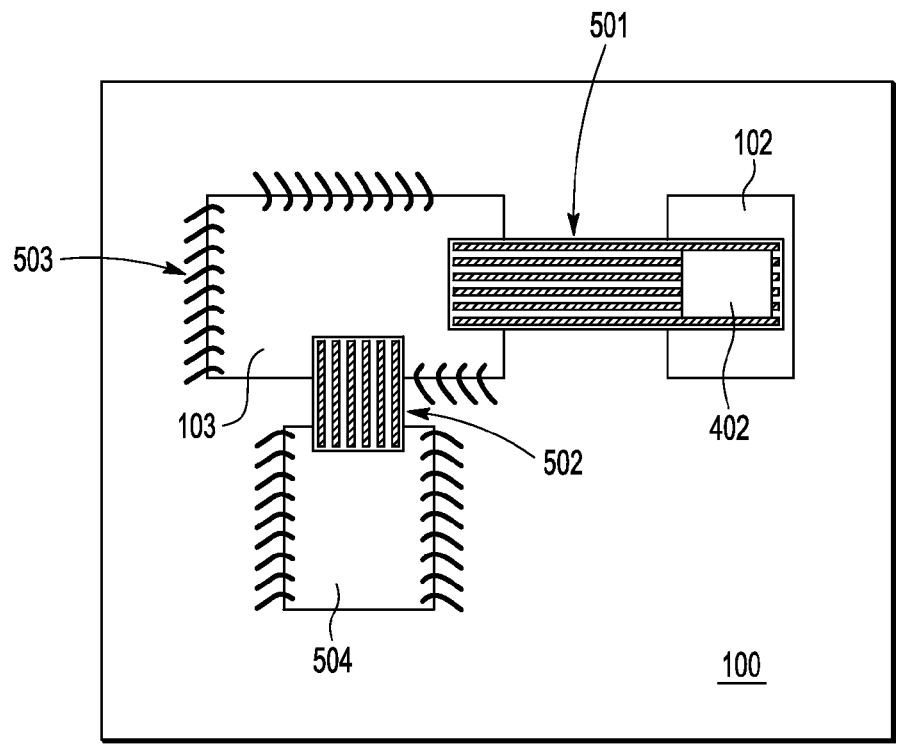
FIG. 5 is top-view diagram of a semiconductor component with a multilayer flex interconnect structure coupling four chips according to some embodiments.

FIG. 5 is top-view diagram of a semiconductor component with multilayer interconnect structures coupling four chips. As shown, chips 102, 103, and 504 are disposed on a same plane defined by substrate 100, and chip 402 is stacked on top of chip 102. Multilayer flex interconnect structure 501 provides electrical connections among chips 102, 103, and/or 402, whereas multilayer flex interconnect structure 502 provides electrical connections between chips 103 and 504.

In this example, the length of multilayer flex interconnect structure 501 is greater than the length of multilayer flex interconnect structure 502. Multilayer flex interconnect structure 502 has a width smaller than the length of chip 103 and the width of chip 504. The width of multilayer flex interconnect structure 501 is smaller than the width of chip 103, but it is greater than the width of chip 402. For a given conductor thickness, the width of a multilayer flex interconnect structure may determine the number of I/O terminals that may be connected on a chip. In cases where an insufficient number of connections are available, a multilayer flex interconnect structure with additional layer(s) of dielectric and/or conductive material may be used.

In some cases, the use of multilayer interconnect structures 501 and 502 may be concurrent with the use of wire bonds 503. Here, for example, chip 103 has wire bonds 503 on three of its sides to which multilayer flex interconnect structure 501 is not coupled, and it also has wire bonds on the same side where multilayer interconnect structure 502 is coupled. Chips 102 and 402 do not have wire bonds, and all of their interconnections are performed with multilayer flex interconnect structure 501. Also, chips 103 and 504 have I/O terminals (connected via multilayer interconnect structures 501 and 502) located near their perimeters, and extending beyond their perimeters, but chips 102 and/or 402 have I/O terminals (connected via multilayer interconnect structure 501) located near their respective centers.

FIGS. 6-9 are cross-section diagrams of various multilayer flex interconnect structures. In some embodiments, multilayer flex interconnect structures 600-900 may be any of multilayer flex interconnect structures 300, 501, or 502 shown in FIGS. 3-5.

Figure 6:
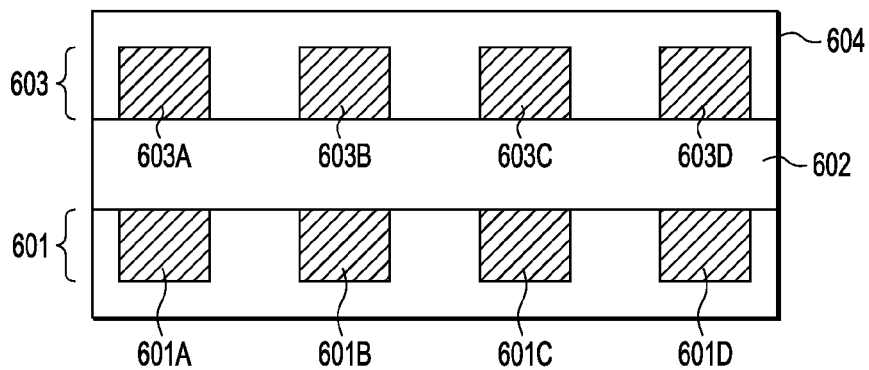
FIGS. 6-9 are cross-section diagrams of various multilayer flex interconnect structures according to some embodiments.

Specifically, FIG. 6 shows multilayer flex interconnect structure 600 having a first conductor layer 603, second conductor layer 601, dielectric layer 602, and protective cover 604. First portion 603A of first conductive layer 603 may provide an electrical connection between a first terminal of a first chip and a first terminal of a second semiconductor chip. Also, first portion 601A of second conductive layer 601 may provide an electrical connection between a second terminal of the first semiconductor chip and a second terminal of the second semiconductor chip.

In some implementations, first portion 603A of first conductive layer 603 may be configured to carry a data signal, and first portion 601A of second conductive layer 601 may be coupled to a reference bus. Alternatively, at least one of portions 601A or 603A may be coupled to voltage bus.

Still referring to FIG. 6, second portion 603B of first conductive layer 603 may provide an electrical connection between a third terminal of the first semiconductor chip and a third terminal of the second semiconductor chip. Second portion 601B of the second conductive layer 601 may provide an electrical connection between a fourth terminal of the first semiconductor chip and a fourth terminal of the second semiconductor chip. In some cases, dielectric layer 602 may be disposed between first portion 603A and second portion 603B of first conductive layer 603, and also between first portion 601A and second portion 601B of second conductive layer 601.

Each of portions 603A-D and 601A-D may be configured to carry signals, extend reference buses, or provide a power supply voltage across I/O terminals of different chips within the same electronic component. Although two layers and four portions per layer are shown, it should be noted that, in other implementations, any other suitable number of layers and/or portions may be used.

Figure 7:
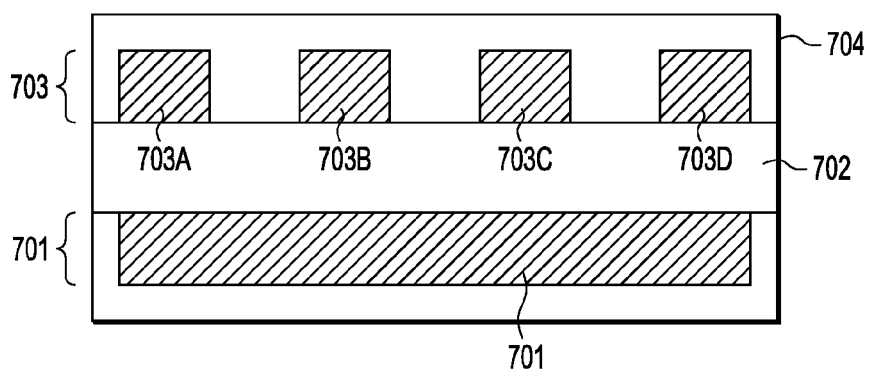

In FIG. 7, portions 703A-D of first conductive layer 703 of multilayer flex interconnect structure 700 correspond to portions 603A-D of FIG. 6, and protective cover 704 corresponds to protective cover 604. However, portions 601A-D of second conductive layer 601 have been replaced with a single, second conductive layer 701. In some cases, second conductive layer 701 may serve as a common reference bus (or common voltage bus) for each of portions 703A-D of the first conductive layer.

Figure 8:
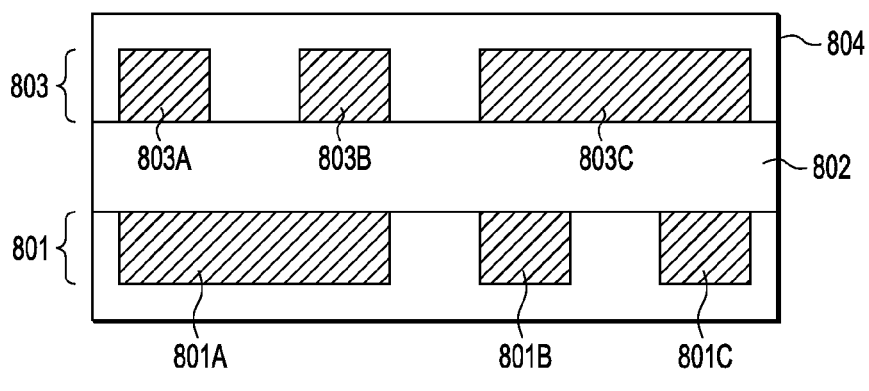

FIG. 8 shows another variation of multilayer flex interconnect structure 800 where first portion 803A and second portion 803B correspond to portions 603A and 603B of FIG. 6, protective cover 804 corresponds to protective cover 604, and the third portion 603C and fourth portion 603D have been combined into a single third portion 803C. In this case, the "third" and "fourth" portions of the first conductive layer 803 are coupled to each other and create a short circuit between two I/O terminals. Similarly, the "first" and "second" portions of the second conductive layer 801 are coupled to each other as portion 801A and create a short circuit between two other I/O terminals.

Figure 9:
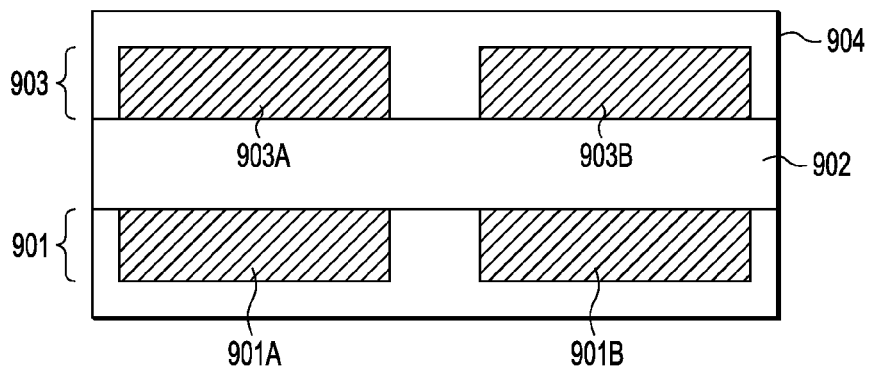

FIG. 9 shows yet another variation of multilayer flex interconnect structure 900 where the "first" and "second" portions of first conductive layer 903 are coupled to each other as portion 903A and create a short circuit between a first pair of I/O terminals, and where the "third" and "fourth" portions of first conductive layer 903 are coupled to each other as portion 903B and create a short circuit between a second pair of I/O terminals. Protective cover 904 corresponds to protective cover 604 of FIG. 6. The "first" and "second" portions of second conductive layer 901 are coupled to each other as portion 901A and create a short circuit between a third pair of I/O terminals, and the "third" and "fourth" portions of second conductive layer 901 are coupled to each other as portion 901B and create a short circuit between a fourth pair of I/O terminals.

In many implementations, semiconductor devices with multilayer flex interconnect structures as disclosed herein may be incorporated into a wide range of electronic devices including, for example, computer systems or Information Technology (IT) products such as servers, desktops, laptops, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Figure 10:
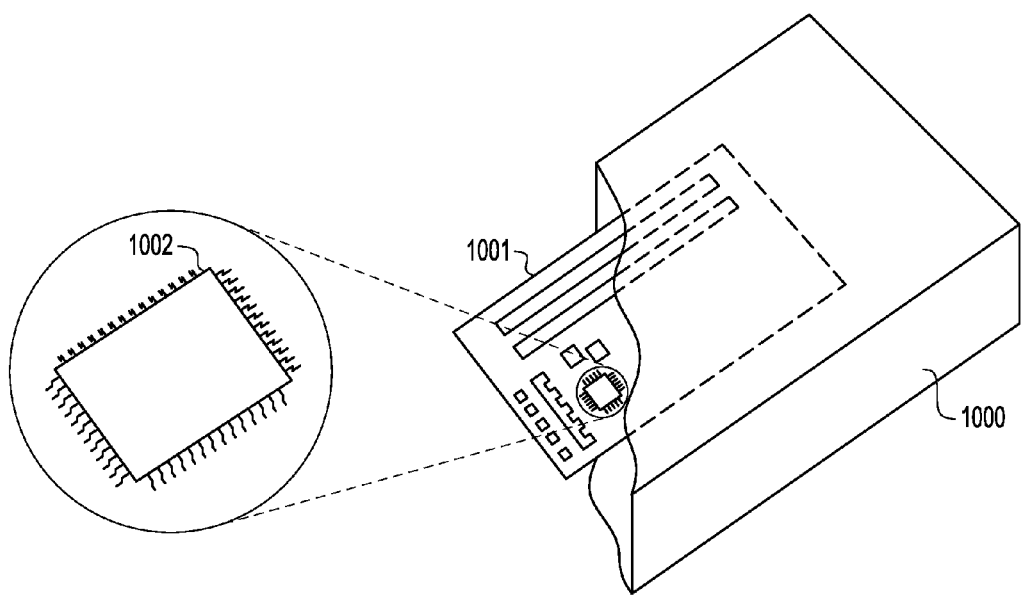
FIG. 10 is a diagram of an example of a Printed Circuit Board (PCB) of a device having one or more electronic chips, according to some embodiments.

Turning to FIG. 10, a diagram of electronic device 1000 is depicted. In some embodiments, electronic device 1000 may be any of the aforementioned electronic devices, or any other electronic device. As illustrated, electronic device 1000 includes one or more Printed Circuit Boards (PCBs) 1001, and at least one of PCBs 1001 includes one or more electronic components 1002. In some implementations, component(s) 1002 may include one or more semiconductor chips, and each chip may use a multilayer flex interconnect structure such as those discussed above.

Examples of component(s) 1002 may include, for instance, an SoC, an ASIC, a Digital Signal Processor (DSP), a Field-Programmable Gate Array (FPGA), a processor, a microprocessor, a controller, a microcontroller, a Graphics Processing Unit (GPU), or the like. Additionally or alternatively, IC(s) may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, IC(s) may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, IC(s) may include one or more Micro-ElectroMechanical Systems (MEMS), Nano-Electro-Mechanical Systems (NEMS), or the like.

Generally speaking, component(s) 1002 may be configured to be mounted onto PCB 1001 using any suitable packaging technology such as, for example, a leaded package, Ball Grid Array (BGA) packaging or the like. In some applications, PCB 1001 may be mechanically mounted within or fastened onto electronic device 1000. It should be noted that, in certain implementations, PCB 1001 may take a variety of forms and/or may include a plurality of other elements or components in addition to chip 1002. It should also be noted, however, that in some embodiments PCB 1001 may not be used and/or component(s) 1002 may assume other forms.

As discussed above, in an illustrative, non-limiting embodiment, a semiconductor device may include a semiconductor chip coupled to a planar substrate; a multilayer flex interconnect structure coupled to the semiconductor chip, the multilayer flex interconnect structure including at least: a first conductive layer, a second conductive layer, and a dielectric layer disposed between the first and second conductive layers; and another semiconductor chip coupled to the planar substrate and placed in a side-by-side configuration with respect to the semiconductor chip, where the multilayer flex interconnect structure provides electrical connections between at least two terminals of the semiconductor chip and at least two terminals of the other semiconductor chip.

For example, the first and second conductive layers may include copper, and the dielectric layer may include polyimide. The multilayer flex interconnect structure and the semiconductor chip may be encapsulated by a mold compound. Also, the multilayer flex interconnect structure may provide an electrical connection between: at least one of the first or second conductive layers, and at least one terminal on the substrate.

In some implementations, the multilayer flex interconnect structure may include a protective cover layer surrounding the first conductive layer, the second conductive layer, and the dielectric layer. The dielectric layer may include one or more vias configured to allow the first conductive layer to be coupled to a contact on the side of the second conductive layer.

In some embodiments, a first portion of the first conductive layer may provide an electrical connection between a first terminal of the semiconductor chip and a first terminal of the other semiconductor chip. A first portion of the second conductive layer may also an electrical connection between a second terminal of the semiconductor chip and a second terminal of the other semiconductor chip.

For instance, the first portion of the first conductive layer may be configured to carry a data signal, and the first portion of the second conductive layer may be coupled to a reference bus. Additionally or alternatively, at least one of the first portion of the first conductive layer or the first portion of the second conductive layer may be coupled to voltage bus.

In other embodiments, a second portion of the first conductive layer may provide an electrical connection between a third terminal of the semiconductor chip and a third terminal of the other semiconductor chip. A second portion of the second conductive layer may provide an electrical connection between a fourth terminal of the semiconductor chip and a fourth terminal of the other semiconductor chip.

In another illustrative, non-limiting embodiment, a multilayer flex interconnect structure may include a first conductive layer having a first portion configured to provide an electrical connection between a first terminal of a first semiconductor chip and a first terminal of a second semiconductor chip, the first and second semiconductor chips coupled to a planar substrate and placed in a side-by-side configuration with respect to each other, a second conductive layer having a first portion configured to provide an electrical connection between a second terminal of the first semiconductor chip and a second terminal of the second semiconductor chip, and a dielectric layer disposed between the first conductive layer and the second conductive layer.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A semiconductor device, comprising:
a first semiconductor chip coupled to a planar substrate;
a second semiconductor chip distinct from the first semiconductor chip and coupled to the same planar substrate in a side-by-side configuration with respect to the first semiconductor chip such that the first and second semiconductor chips are parallel with respect to each other and to the planar substrate;
a multilayer flex interconnect structure coupled to the first and second semiconductor chips wherein the multilayer flex interconnect structure includes a flexible plastic material or film, wherein the multilayer flex interconnect structure further includes at least: a first conductive layer, a second conductive layer, and a dielectric layer disposed between the first and second conductive layers, and wherein the multilayer flex interconnect structure provides electrical connections between at least two terminals of the first semiconductor chip and at least two terminals of the second semiconductor chip; and
a mold compound configured to encapsulate the first semiconductor chip and the second semiconductor chip, to surround at least two distinct outer surfaces of the multilayer flex interconnect structure such that the at least two distinct surfaces are horizontally disposed with respect to the first and second semiconductor chips to create a package in the form of a monolithic electronic component.

2. The semiconductor device of claim 1, wherein the first and second conductive layers include copper.

3. The semiconductor device of claim 1, wherein the dielectric layer includes polyimide.

4. The semiconductor device of claim 1, wherein the multilayer flex interconnect structure includes two bent or curved portions with a middle portion between the two bent or curved portions, wherein the middle portion provides an electrical connection between: at least one of the first or second conductive layers, and at least one terminal on the planar substrate, and wherein the middle portion includes the at least two distinct outer surfaces of the multilayer flex interconnect structure.

5. The semiconductor device of claim 1, the multilayer flex interconnect structure further including a protective cover layer surrounding the first conductive layer, the second conductive layer, and the dielectric layer.

6. The semiconductor device of claim 1, wherein the dielectric layer includes one or more vias configured to allow the first conductive layer to be coupled to a contact on the side of the second conductive layer.

7. The semiconductor device of claim 1, wherein a first portion of the first conductive layer provides an electrical connection between a first terminal of the semiconductor chip and a first terminal of the other semiconductor chip.

8. The semiconductor device of claim 7, wherein a first portion of the second conductive layer provides an electrical connection between a second terminal of the semiconductor chip and a second terminal of the other semiconductor chip.

9. The semiconductor device of claim 8, wherein the first portion of the first conductive layer is configured to carry a data signal, and wherein the first portion of the second conductive layer is coupled to a reference bus.

10. The semiconductor device of claim 8, wherein at least one of the first portion of the first conductive layer or the first portion of the second conductive layer is coupled to voltage bus.

11. The semiconductor device of claim 8, wherein a second portion of the first conductive layer provides an electrical connection between a third terminal of the semiconductor chip and a third terminal of the other semiconductor chip.

12. The semiconductor device of claim 11, wherein a second portion of the second conductive layer provides an electrical connection between a fourth terminal of the semiconductor chip and a fourth terminal of the other semiconductor chip.

13. A multilayer flex interconnect structure, comprising:
a first conductive layer having a first portion configured to provide an electrical connection between a first terminal of a first semiconductor chip and a first terminal of a second semiconductor chip distinct from the first semiconductor chip, the first and second semiconductor chips coupled to a planar substrate and placed in a side-by-side configuration with respect to each other such that the first and second semiconductor chips are parallel with respect to each other and to the planar substrate;
a second conductive layer having a first portion configured to provide an electrical connection between a second terminal of the first semiconductor chip and a second terminal of the second semiconductor chip; and
a dielectric layer disposed between the first conductive layer and the second conductive layer, wherein the multilayer flex interconnect structure includes two bendable or curved portions with a middle portion between the two bendable or curved portions, wherein the middle portion is parallel with respect to the first semiconductor chip, the second semiconductor chip, and the planar substrate, and wherein the middle portion is configured to provide an electrical connection between: at least one of the first or second conductive layers, and at least one terminal on the planar substrate.

14. The multilayer flex interconnect structure of claim 13, wherein the first and second conductive layers include copper.

15. The multilayer flex interconnect structure of claim 13, wherein the dielectric layer includes polyimide.

16. The multilayer flex interconnect structure of claim 13, wherein the first and second semiconductor chips are encapsulated by a mold compound, the configured to encapsulate the first semiconductor chip and the second semiconductor chip, to surround at least two distinct outer surfaces of the multilayer flex interconnect structure such that the at least two distinct surfaces are horizontally disposed with respect to the first and second semiconductor chips to create a package in the form of a monolithic electronic component.

17. The multilayer flex interconnect structure of claim 13, wherein the first portion of the first conductive layer is configured to carry a data signal, and wherein the first portion of the second conductive layer is coupled to a reference bus.

18. The multilayer flex interconnect structure of claim 13, wherein at least one of the first portion of the first conductive layer or the first portion of the second conductive layer is coupled to voltage bus.

19. The multilayer flex interconnect structure of claim 13, wherein the dielectric layer includes one or more vias configured to allow the first conductive layer to be coupled to a contact on the side of the second conductive layer.

\* \* \* \* \*